(12) United States Patent
Yoo et al.

(10) Patent No.: US 9,123,822 B2
(45) Date of Patent: Sep. 1, 2015

(54) SPLIT GATE NON-VOLATILE FLASH MEMORY CELL HAVING A SILICON-METAL FLOATING GATE AND METHOD OF MAKING SAME

(71) Applicant: Silicon Storage Technology, Inc., San Jose, CA (US)

(72) Inventors: Jong-Won Yoo, Cupertino, CA (US);
Alexander Kotov, San Jose, CA (US);
Yuri Tkachev, Sunnyvale, CA (US);
Chien-Sheng Su, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/958,483

(22) Filed: Aug. 2, 2013

(65) Prior Publication Data
US 2015/0035040 A1    Feb. 5, 2015

(51) Int. Cl.
| | |
|---|---|
| *H01L 29/788* | (2006.01) |
| *H01L 29/66* | (2006.01) |
| *H01L 21/28* | (2006.01) |
| *H01L 29/423* | (2006.01) |
| *H01L 27/115* | (2006.01) |

(52) U.S. Cl.
CPC ........ *H01L 29/788* (2013.01); *H01L 21/28273* (2013.01); *H01L 27/11521* (2013.01); *H01L 29/42328* (2013.01); *H01L 29/66825* (2013.01); *H01L 29/7881* (2013.01); *H01L 29/7883* (2013.01)

(58) Field of Classification Search
CPC .................. H01L 27/11517; H01L 27/11521; H01L 29/42328; H01L 29/66825; H01L 29/7883

USPC .......................................... 257/315, 316, 317
See application file for complete search history.

(56) References Cited

U.S. PATENT DOCUMENTS

| | | |
|---|---|---|
| 2009/0039410 A1 | 2/2009 | Liu et al. |
| 2009/0140317 A1* | 6/2009 | Rosmeulen ................... 257/316 |
| 2009/0207662 A1 | 8/2009 | Wang et al. |

(Continued)

FOREIGN PATENT DOCUMENTS

EP    2 068 351 A1    6/2009

OTHER PUBLICATIONS

PCT Search Report and Written Opinion dated Oct. 27, 2014 corresponding to the related PCT Patent Application No. US14/48787.

(Continued)

*Primary Examiner* — Daniel Whalen
(74) *Attorney, Agent, or Firm* — DLA Piper LLP (US)

(57) ABSTRACT

A non-volatile memory cell includes a substrate of a first conductivity type with first and second spaced apart regions of a second conductivity type, forming a channel region therebetween. A select gate is insulated from and disposed over a first portion of the channel region which is adjacent to the first region. A floating gate is insulated from and disposed over a second portion of the channel region which is adjacent the second region. Metal material is formed in contact with the floating gate. A control gate is insulated from and disposed over the floating gate. An erase gate includes a first portion insulated from and disposed over the second region and is insulated from and disposed laterally adjacent to the floating gate, and a second portion insulated from and laterally adjacent to the control gate and partially extends over and vertically overlaps the floating gate.

2 Claims, 17 Drawing Sheets

(56) References Cited

U.S. PATENT DOCUMENTS

| | | |
|---|---|---|
| 2010/0054043 A1* | 3/2010 | Liu et al. ............... 365/185.29 |
| 2011/0006355 A1* | 1/2011 | Shen et al. ............... 257/316 |
| 2011/0121381 A1 | 5/2011 | Kanemura |
| 2012/0243337 A1 | 9/2012 | Lee et al. |

OTHER PUBLICATIONS

Wellekens, et al., "An Ultra-Thin Hybrid Floating Gate Concept for Sub-20nm NAND Flash Technologies," Memory Workshop, 2011 3rd IEEE International, May 22, 2011, pp. 1-4.

* cited by examiner

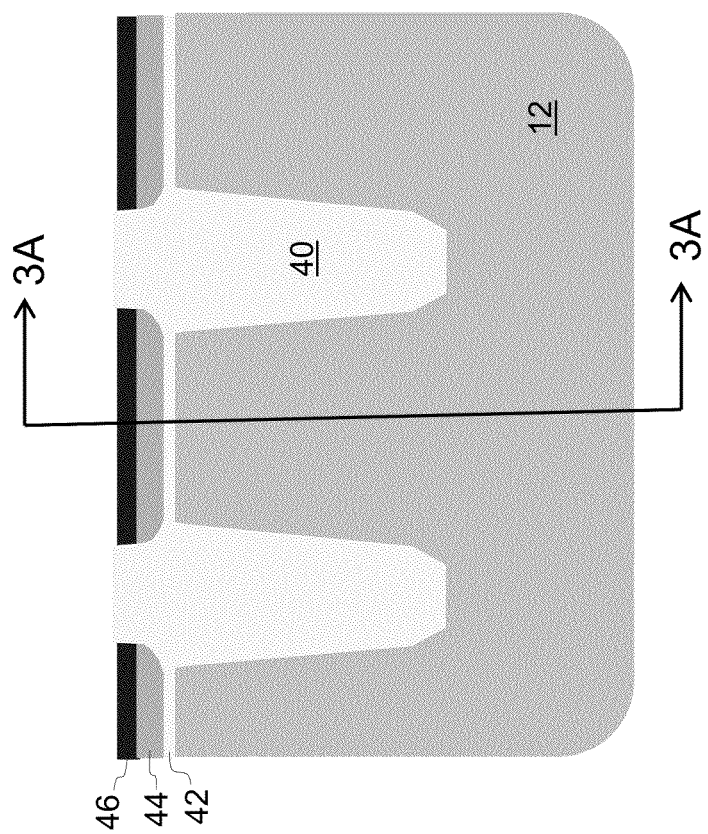

SPLIT GATE NON-VOLATILE FLASH MEMORY CELL HAVING A SILICON-METAL FLOATING GATE AND METHOD OF MAKING SAME

TECHNICAL FIELD

The present invention relates to a non-volatile flash memory cell which has a select gate, a silicon-metal floating gate, a control gate, and an erase gate having an overhang with the floating gate.

BACKGROUND OF THE INVENTION

Split gate non-volatile flash memory cells having a select gate, a floating gate, a control gate and an erase gate are well known in the art. See for example U.S. Pat. Nos. 6,747,310 and 7,868,375. An erase gate having an overhang over the floating gate is also well know in the art. See for example, U.S. Pat. No. 5,242,848. All three of these patents are incorporated herein by reference in their entirety.

In order to increase performance, the floating gate can be doped with impurities. For example, increasing the dopant level on the floating gate can increase the erase speed of the memory cell. However, there are drawbacks to increased doping. For example, out-diffuse of dopants from a highly doped floating gate can decrease the quality of the dielectric material surrounding the floating gate. Higher dopant levels can also cause the blunting of the floating gate tip during oxidation processes.

Accordingly, it is one of the objectives of the present invention to improve the erase efficiency of such a memory cell without relying on high levels of dopant in the floating gate.

SUMMARY OF THE INVENTION

The aforementioned objectives are achieved with a non-volatile memory cell that includes a substrate of a first conductivity type, having a first region of a second conductivity type, a second region of the second conductivity type spaced apart from the first region, forming a channel region therebetween, a select gate insulated from and disposed over a first portion of the channel region which is adjacent to the first region, a floating gate insulated from and disposed over a second portion of the channel region which is adjacent the second region, metal material formed in contact with the floating gate, a control gate insulated from and disposed over the floating gate and an erase gate that includes first and second portions. The first portion is insulated from and disposed over the second region, and is insulated from and disposed laterally adjacent to the floating gate. The second portion is insulated from and laterally adjacent to the control gate, and partially extends over and vertically overlaps the floating gate.

A method of forming a non-volatile memory cell includes forming, in a substrate of a first conductivity type, spaced apart first and second regions of a second conductivity type, defining a channel region therebetween, forming a select gate insulated from and disposed over a first portion of the channel region which is adjacent to the first region, forming a floating gate insulated from and disposed over a second portion of the channel region which is adjacent the second region, forming metal material in contact with the floating gate, forming a control gate insulated from and disposed over the floating gate, and forming an erase gate that includes first and second portions. The first portion is insulated from and disposed over the second region, and is insulated from and disposed laterally adjacent to the floating gate. The second portion is insulated from and laterally adjacent to the control gate, and partially extends over and vertically overlaps the floating gate.

BRIEF DESCRIPTION OF THE DRAWINGS

FIGS. 2A-2C and 3A-3J are cross sectional views of a process to make one embodiment the memory cell of the present invention.

DETAILED DESCRIPTION OF THE INVENTION

Figure 1:
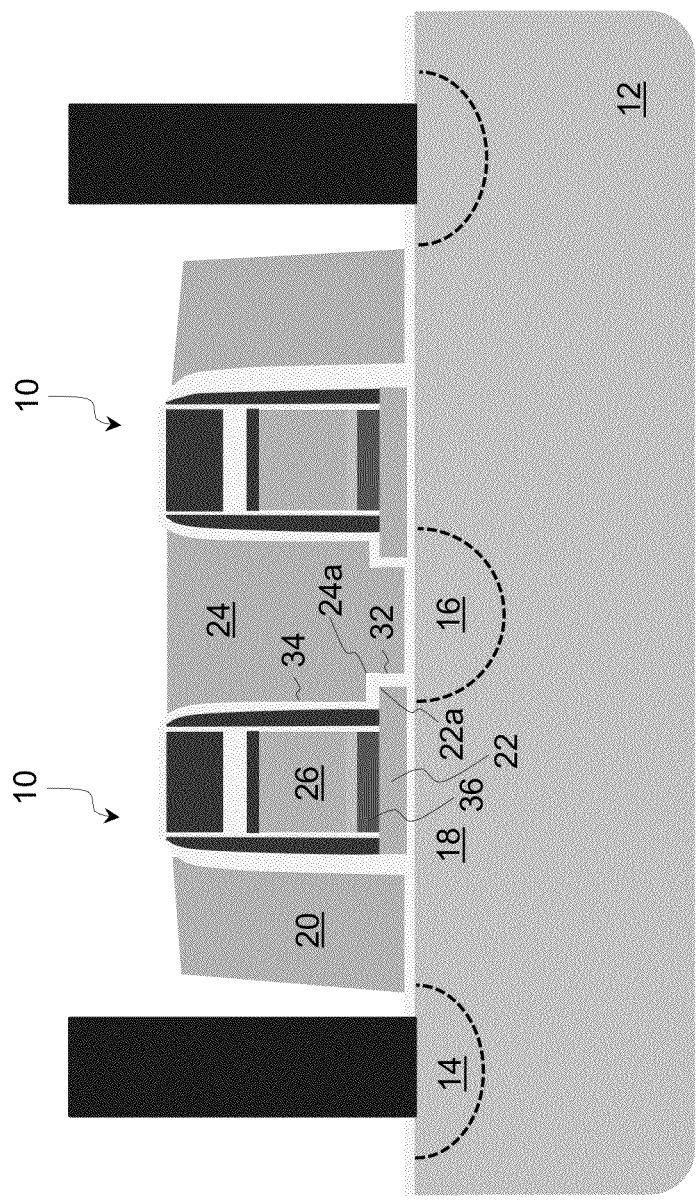
FIG. 1 is a cross sectional view of an improved non-volatile memory cell of the present invention.

Referring to FIG. 1 there is shown a cross-sectional view of an improved non-volatile memory cell 10 of the present invention. The memory cell 10 is made in a substantially single crystalline substrate 12, such as single crystalline silicon, which is of P conductivity type. Within the substrate 12 is a first region 14 of a second conductivity type. If the first conductivity type is P then the second conductivity type is N. Spaced apart from the first region is a second region 16 of the second conductivity type. Between the first region 14 and the second region 16 is a channel region 18, which provides for the conduction of charges between the first region 14 and the second region 16.

Positioned above, and spaced apart and insulated from the substrate 12 is a select gate 20, also known as the word line 20. The select gate 20 is positioned over a first portion of the channel region 18. The first portion of the channel region 18, immediately abuts the first region 14. Thus, the select gate 20 has little or no overlap with the first region 14. A floating gate 22 is also positioned above and is spaced apart and is insulated from the substrate 12. The floating gate 22 is positioned over a second portion of the channel region 18 and a portion of the second region 16. The second portion of the channel region 18 is different from the first portion of the channel region 18. Thus, the floating gate 22 is laterally spaced apart and is insulated from and is adjacent to the select gate 20. An erase gate 24 is positioned over and spaced apart from the second region 16, and is insulated from the substrate 12. The erase gate 24 is laterally insulated and spaced apart from the floating gate 22. The select gate 20 is to one side of the floating gate 22, with the erase gate 24 to another side of the floating gate 22. Finally, positioned above the floating gate 22 and insulated and spaced apart therefrom is a control gate 26. The control gate 26 is insulated and spaced apart from the erase gate 24 and the select gate 20, and is positioned between the erase gate 24 and the select gate 20. Thus far, the foregoing description of the memory cell 10 is disclosed in U.S. Pat. Nos. 6,747,310 and 7,868,375.

The erase gate 24 has a portion that overhangs the floating gate 22. The erase gate 24 comprises of two parts that are electrically connected. In the preferred embodiment, the two parts form a monolithic structure, although it is within the present invention that the two parts can be separate parts and electrically connected. A first part of the erase gate 24 is laterally adjacent to the floating gate 22 and is above the second region 16. The first part of the erase gate 24 has an end 32 that is closest to the floating gate 22. The second part of the erase gate 24 is laterally adjacent to the control gate 26 and overhangs a portion of the floating gate 22 (i.e. there is partial vertical overlap of the erase gate 24 and the floating gate 22). The second part of the erase gate 24 which is laterally adjacent to the control gate 26 and overhangs the floating gate 22 is also vertically spaced apart from the floating gate 22.

In the improvement of the present invention, a layer of metal 36 is formed on the floating gate 22 (below and insulated from the control gate 26). Preferably, the layer of metal 36 is formed on that portion of the floating gate vertically covered by the control gate, but the metal layer 36 is not formed on that portion of the floating gate vertically covered by the erase gate 24 (i.e. in this embodiment there is no vertical overlap between the erase gate 24 and the metal layer 36). The metal layer 36 provides a much higher concentration of electrons than highly doped polysilicon for increased erase performance, yet without the drawbacks of using highly doped polysilicon.

As described in U.S. Pat. No. 6,747,310, the memory cell 10 erases by electrons tunneling through the Fowler-Nordheim mechanism, from the floating gate 22 to the erase gate 24. Further, to improve the erase mechanism, the floating gate 22 may have a sharp corner 22a closest to the erase gate 24 (facing a notch 24a formed therein) to enhance the local electrical field during erase and in turn enhance the flow of electrons from the corner of the floating gate 22 to the erase gate 24. By having the metal layer 36 extend across only part of the top surface of the floating gate (i.e. not that part of the floating gate adjacent the erase gate 24), tunneling between the polysilicon corner of the floating gate 22 and the polysilicon erase gate 24 is preserved.

Figure 2A:
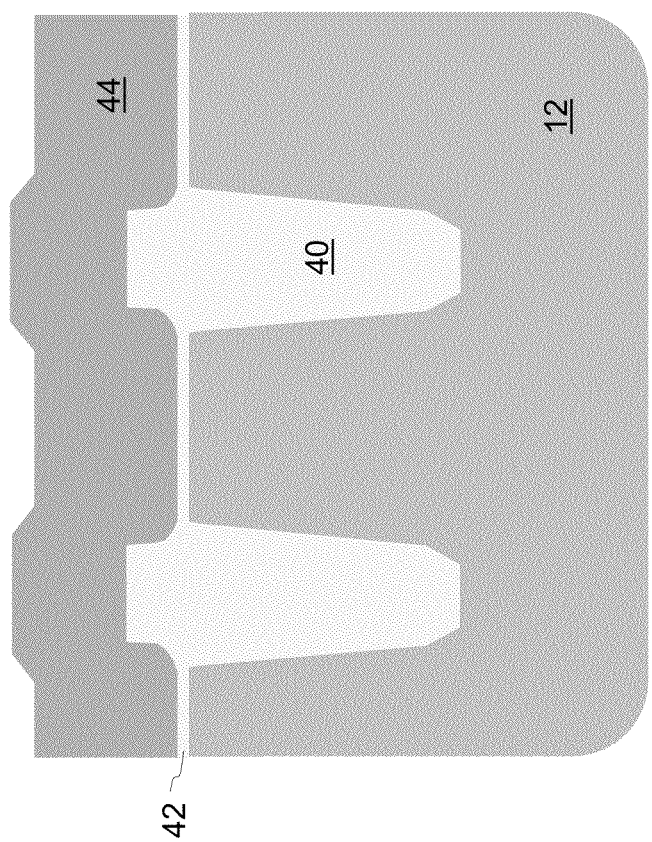

Referring to FIGS. 2A-2C and 3A-3J there are shown cross-sectional views of the steps in the process to make cell 10 of the present invention. FIG. 2A shows STI isolation regions formed in the substrate, which is well known in the art. STI insulation material 40 is deposited or formed in trenches into the substrate, whereby the insulation material 40 extends above the surface of the substrate. The substrate can be P type single crystalline silicon. A layer of silicon dioxide 42 is formed on the substrate 12 of P type single crystalline silicon. Thereafter a first layer 44 of polysilicon (or amorphous silicon) is deposited or formed on the layer 42 of silicon dioxide.

Figure 2B:
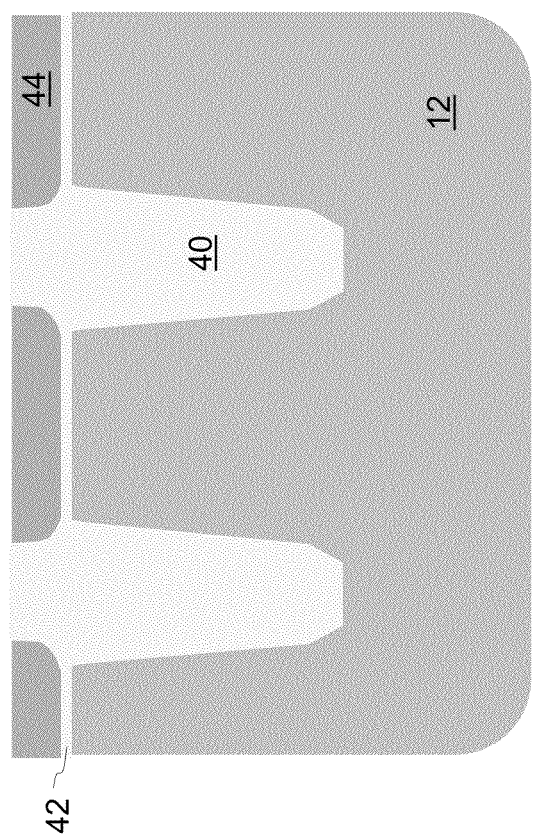

A polysilicon chemical-mechanical polish (CMP) process is performed, using the tops of the STI insulation as an etch stop, to lower the top surface of the poly layer 44, as shown in FIG. 2B. The upper surface of the poly layer 44 is lowered further with a poly etch. A metal material is deposited on the structure, followed by a metal CMP etch using the STI insulation material as an etch step. Suitable metal materials include TiN, TaN, Ti, Pt, etc. The resulting structure is shown in FIG. 2C.

Figure 3A:
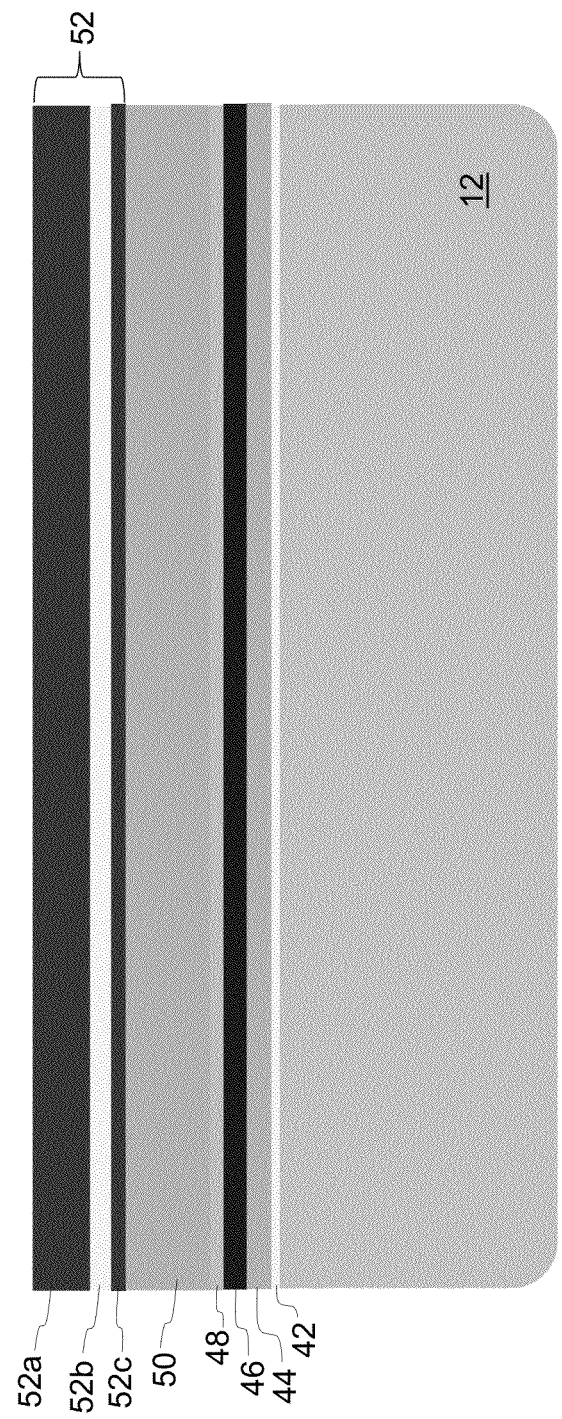
Figure 3B:
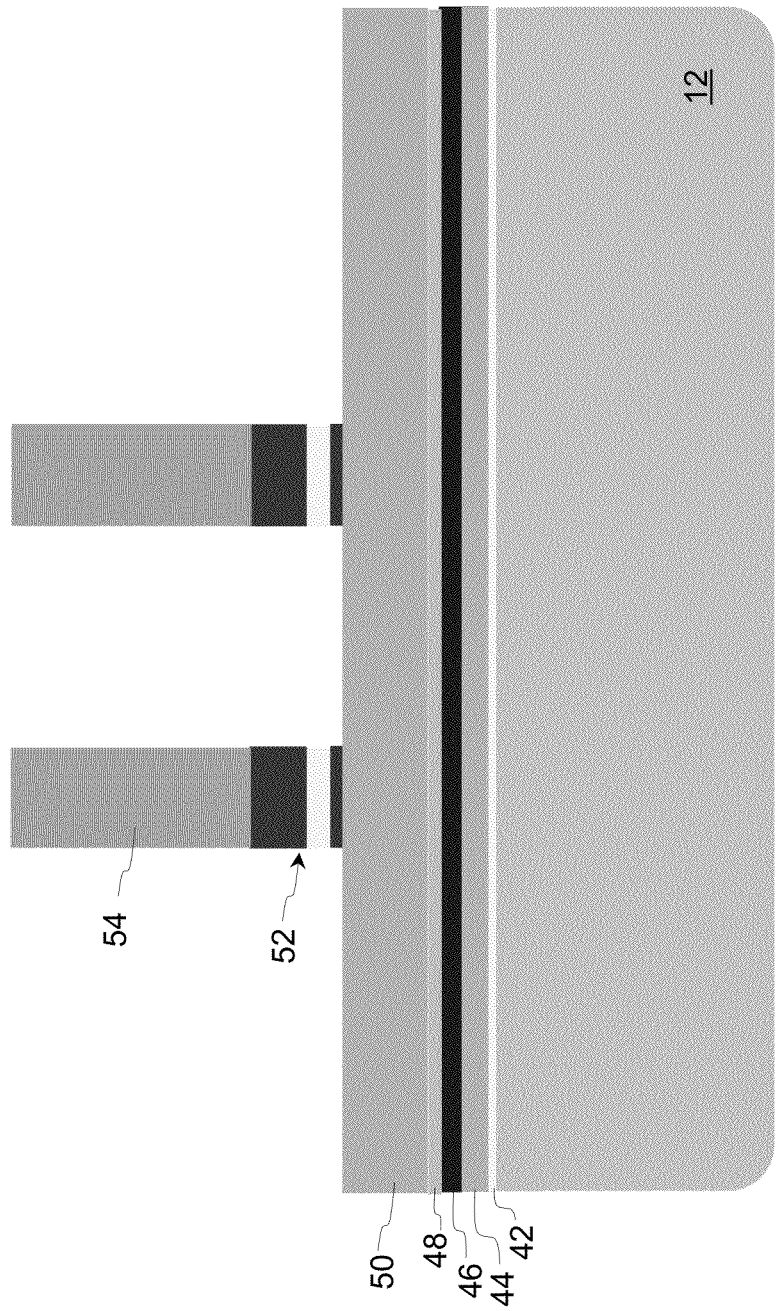
Figure 3C:
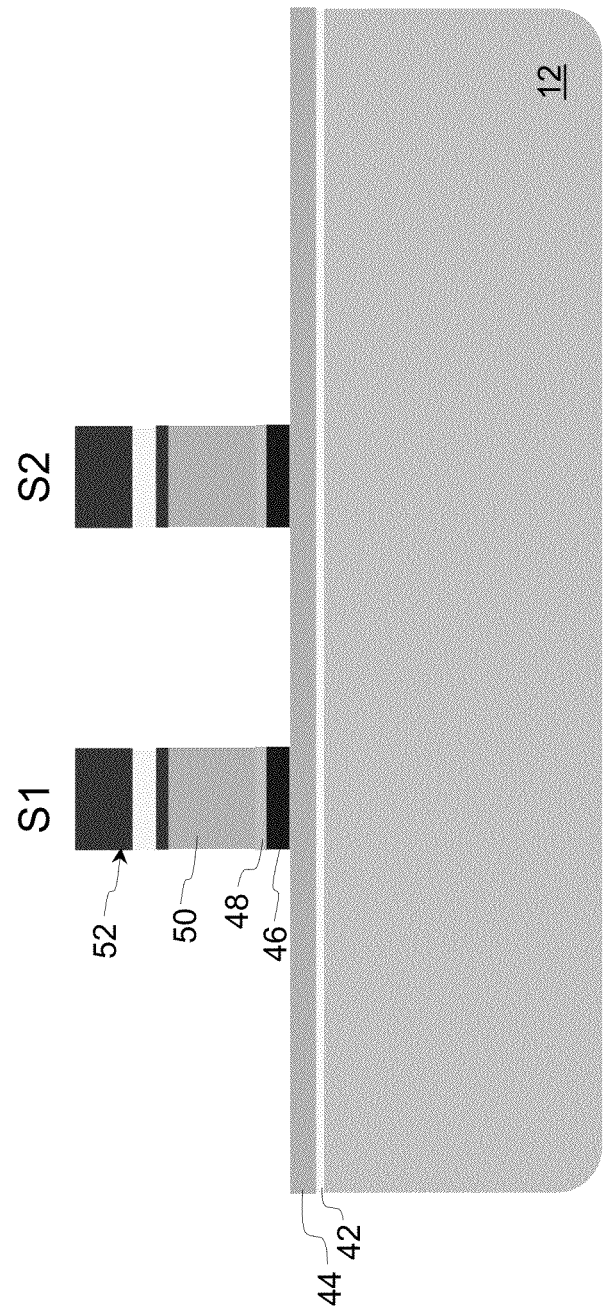

Referring to FIG. 3A there is shown a cross sectional view orthogonal to that of FIGS. 2A-2C (along line 3A as indicated in FIG. 2C). Another insulating layer 48, such as silicon dioxide (or even a composite layer, such as ONO) is deposited or formed on the metal layer 46. A second layer 50 of polysilicon is then deposited or formed on the layer 48. Another layer 52 of insulator is deposited or formed on the second layer 50 of polysilicon and used as a hard mask during subsequent dry etching. In the preferred embodiment, the layer 52 is a composite layer, comprising silicon nitride 52a, silicon dioxide 52b, and silicon nitride 52c. The resulting structure is shown in FIG. 3A Photoresist material 54 is deposited on the structure, and a masking step is formed exposing selected portions of the photoresist material. The photoresist is developed and selectively etched. The exposed portions of composite layer 52 are then anisotropically etched until poly layer 50 is exposed, as shown in FIG. 3B. The photoresist material 54 is removed, and using the stacks of composite layer 52 as an etch mask, the second layer 50 of polysilicon, the insulating layer 48, and the metal layer 46 are then anisotropically etched, until the poly layer 44 is exposed. The resultant structure is shown in FIG. 3C. Although only two "stacks" S1 and S2 are shown, it should be clear that there are number of such "stacks" that are separated from one another.

Figure 3D:
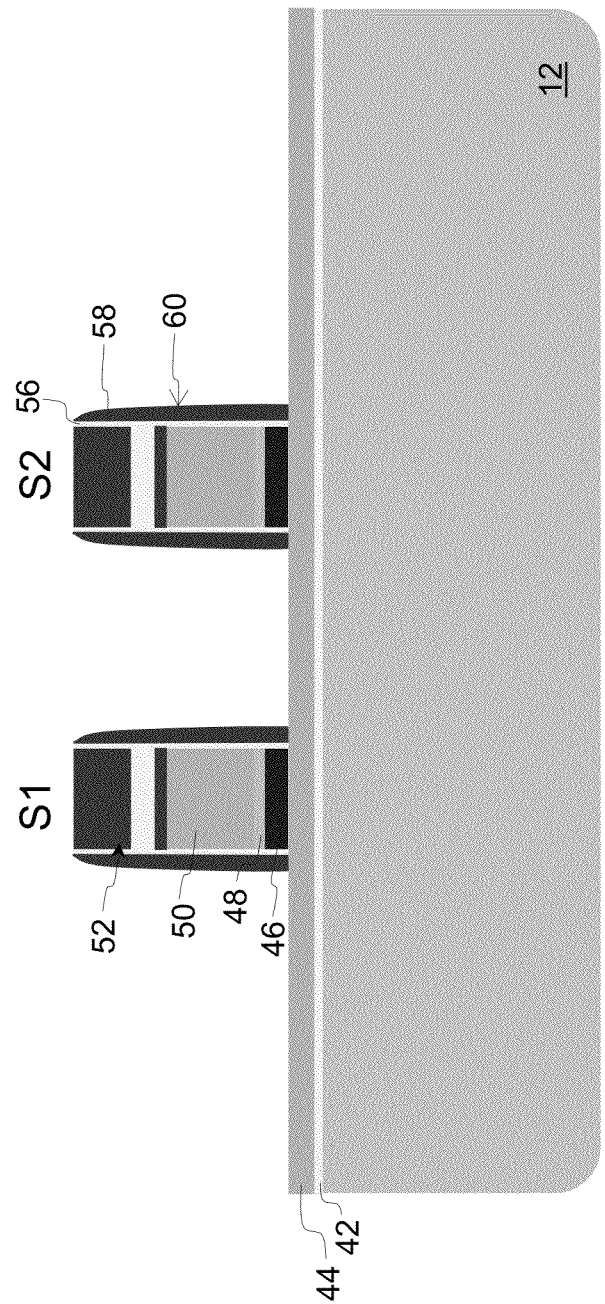

Silicon dioxide 56 is deposited or formed on the structure. This is followed by the deposition of silicon nitride layer 58. The silicon dioxide 49 and silicon nitride 50 are anisotropically etched leaving a spacer 60 (which is the combination of the silicon dioxide 56 and silicon nitride 58) around each of the stacks S1 and S2. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). The resultant structure is shown in FIG. 3D.

A photoresist mask 62 is formed over the regions between the stacks S1 and S2, and other alternating pairs stacks. For the purpose of this discussion, this region between the stacks S1 and S2 will be called the "inner region" and the regions not covered by the photoresist, shall be referred to as the "outer regions". The exposed first polysilicon 44 in the outer regions is anisotropically etched. The resultant structure is shown in FIG. 3E.

Figure 3E:
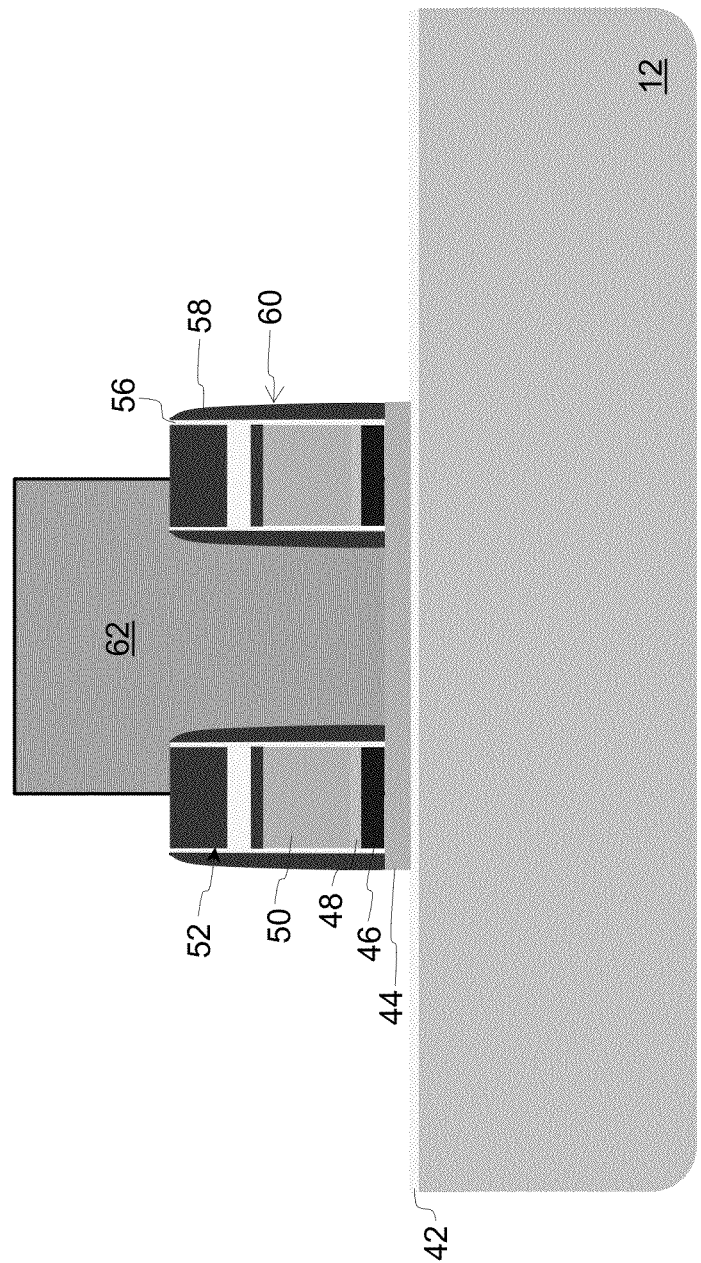
Figure 3F:
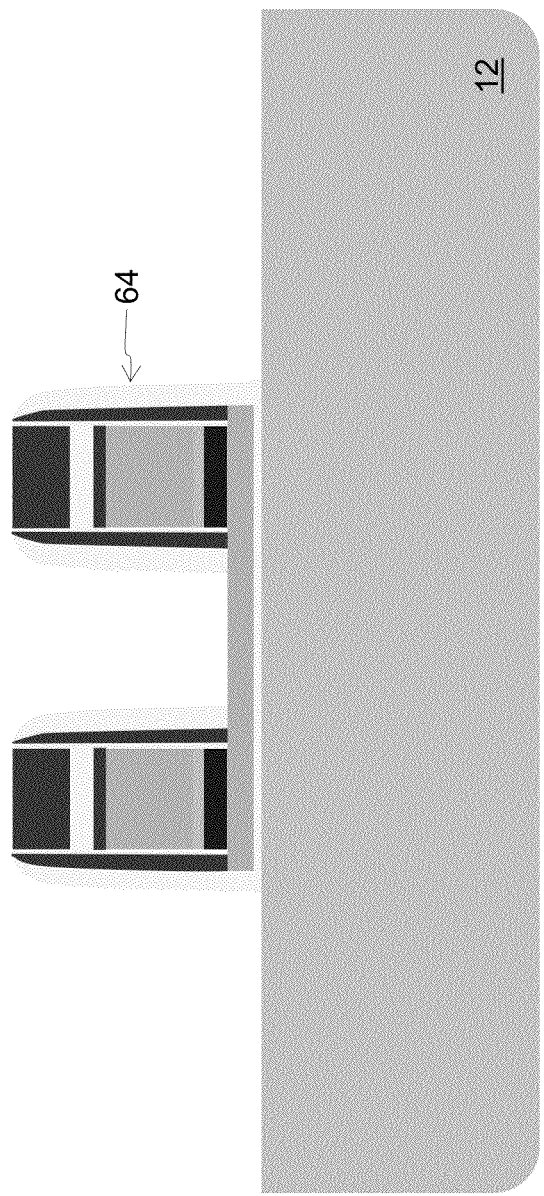
Figure 3G:
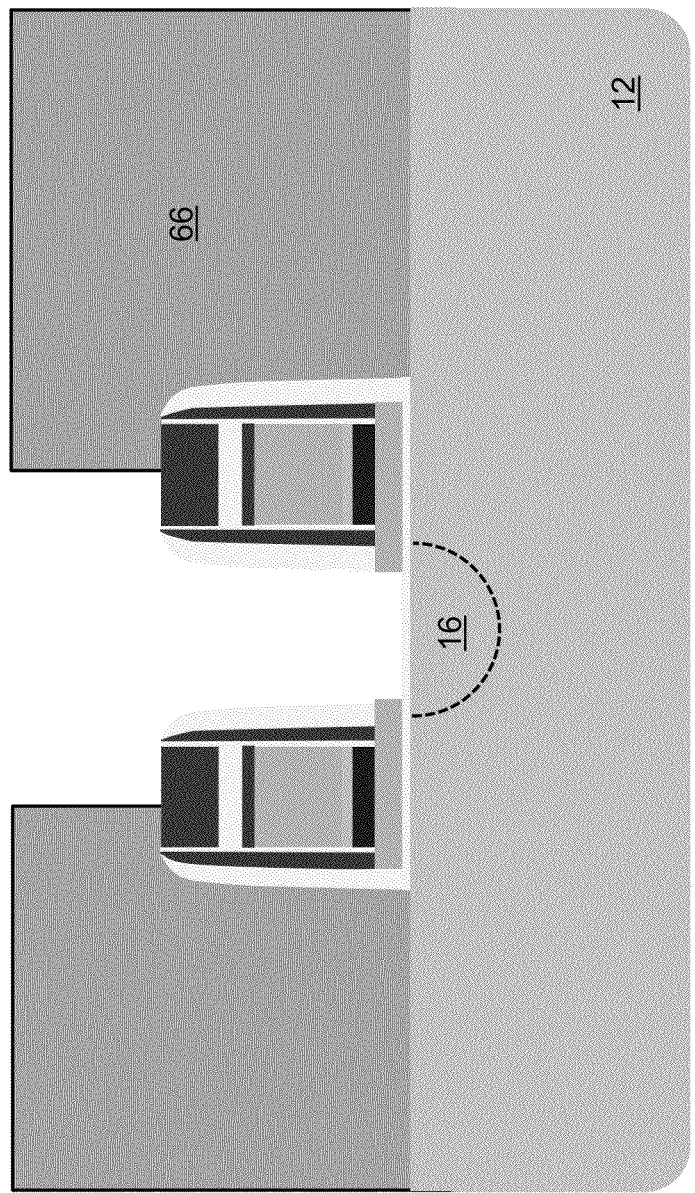

The photoresist material 62 is removed from the structure shown in FIG. 3E. A layer of oxide is then deposited or formed over the structure, followed by an anisotropic etch leaving spacers 64 adjacent to the stacks S1 and S2, as shown in FIG. 3F. Photoresist material 66 is then deposited and is masked leaving openings in the inner regions between the stacks S1 and S2. The polysilicon 44 in the inner regions between the stacks S1 and S2 (and other alternating pairs of stacks) is anisotropically etched. The resultant structure is subject to a high voltage ion implant forming the second regions 16. The resultant structure is shown in FIG. 3G.

Figure 3H:
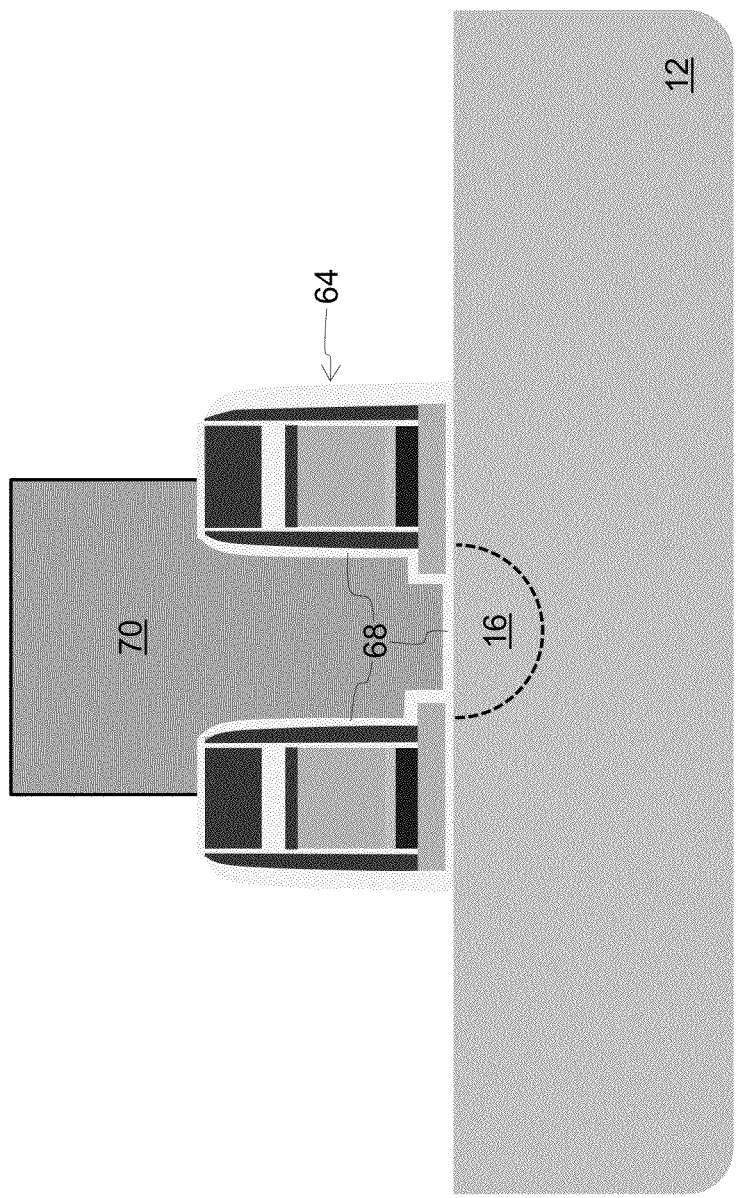

The oxide spacers 64 adjacent to the stacks S1 and S2 in the inner region are removed by e.g. a wet etch or a dry isotropic etch. This etch also removes oxide layer 42 over the second region 16. The photoresist material 66 in the outer regions of the stacks S1 and S2 is removed. Silicon dioxide 68 is deposited or formed over the structure. The structure is once again covered by photoresist material 70 and a masking step is performed exposing the outer regions of the stacks S1 and S2 and leaving photoresist material 70 covering the inner region between the stacks S1 and S2. An oxide anisotropic etch is performed, to reduce the thickness of the spacers 64 in the outer regions of the stack S1 and S2, and to completely remove any silicon dioxide from the exposed silicon substrate 12 in the outer regions. The resultant structure is shown in FIG. 3H.

Figure 3I:
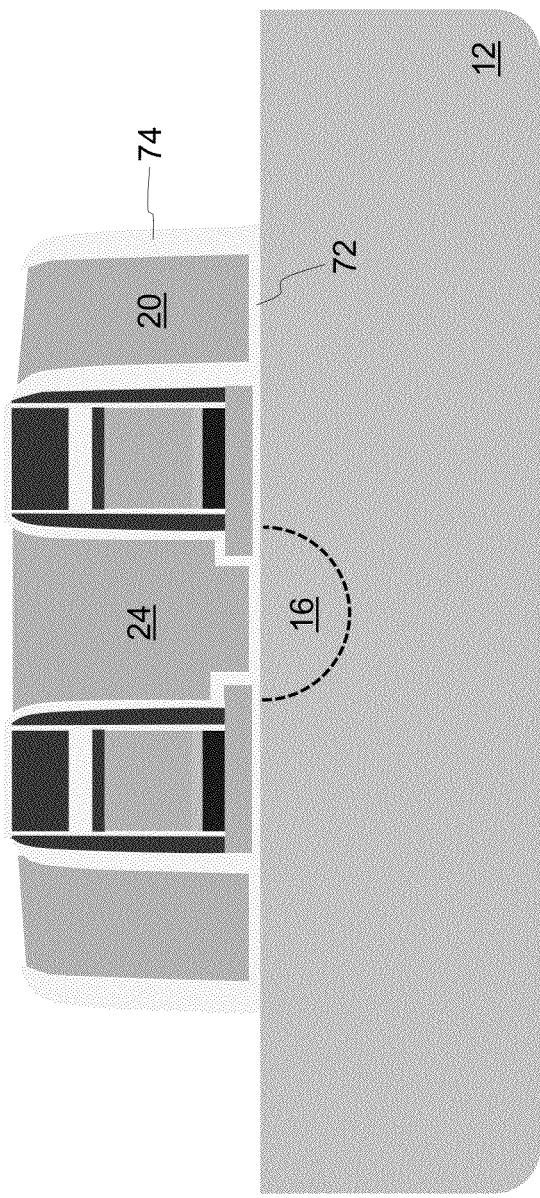

The photoresist material 70 is removed. A thin layer 72 of silicon dioxide, on the order of 20-100 angstroms, is formed on the structure. This oxide layer 72 is the gate oxide between the select gate 20 and the substrate 12. It also thickens oxide layer 68 in the inner region. Polysilicon is deposited over the structure, followed by an anisotropic etch to result in polysilicon spacers in the outer regions of the stack S1 and S2 which constitute the select gates 20 of two memory cells 10 adjacent to one another sharing a common second region 16. In addition, the spacers within the inner regions of the stacks S1 and S2 are merged together forming a single erase gate 24 which is shared by the two adjacent memory cells 10. A layer of insulation material is deposited on the structure, and etched anisotropically to form spacers 74 next to the select gates 20. The resulting structure is shown in FIG. 3I.

Figure 3J:
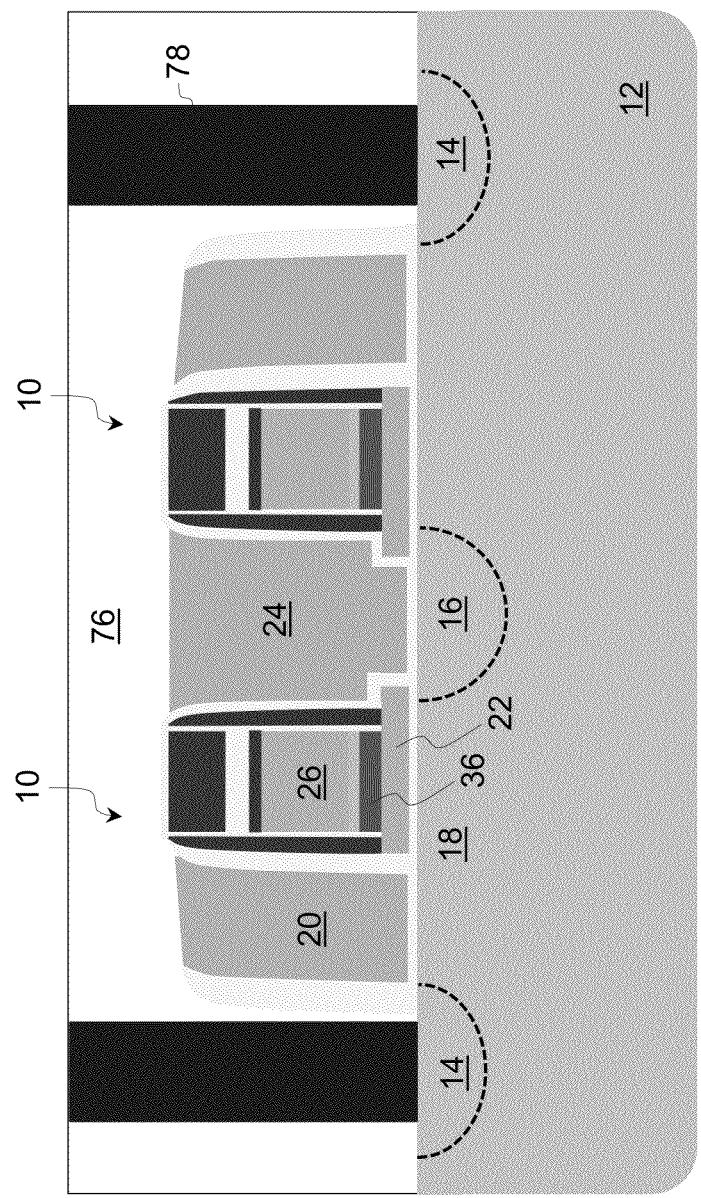

Thereafter, an ion implant step is performed forming the first regions 14. Each of these memory cells on another side share a common first region 14. The structure is covered by insulation material 76. An lithographic etch process is used to create holes extending down and exposing the first regions 14. The holes are lined or filed with conductive material to form bit line contacts 78. The final structure is shown in FIG. 3J. The overhang between the erase gate 24 and floating gate 22 enhances erase performance, as does the metal layer 36 on floating gate 22. Specifically, the metal layer 36 provides an almost unlimited source of electrons, and thus provides sufficient carrier source for cell operation while maintaining a lower floating gate doping to prevent outdiffusion and/or corner blunting. The inclusion of metal layer 36 also allows the floating gate (and thus the memory cell in general) to be scaled down to smaller dimensions.

The operations of program, read and erase and in particular the voltages to be applied may be the same as those as set forth in U.S. Pat. No. 6,747,310, whose disclosure is incorporated herein by reference in its entirety.

However, the operating conditions may also be different. For example, for erase operation, the following voltages may be applied.

gate. The high voltage coupled to the floating gate induces FG channel inversion and concentrates lateral field in the split area to generate hot electrons more effectively. In addition, the voltages provide a high vertical field to attract hot electron into the floating gate and reduce injection energy barrier.

For reading, the following voltages may be applied.

| WL (20) | | BL (78) | | SL (16) | | CG (26) | | EG (24) | |
|---|---|---|---|---|---|---|---|---|---|
| Select | Unselect | Select | Unselect | Select | Unselect | Select | Unselect | Select | Unselect |
| 1.5-3.7 v | 0 v | 0.5-1.5 v | 0 v | 0 v | 0 v | 0 v-3.7 V | 0 v | 0 v-3.7 V | 0 v |

During read, depending upon the balance between program and read operations, the voltages on the select control gate 26 and the select erase gate 24 can be balanced because each is coupled to the floating gate. Thus, the voltages applied to each of the select control gate 26 and select erase gate 24 can be a combination of voltages ranging from 0 to 3.7V to achieve optimum window. In addition, because voltage on the select control gate is unfavorable due to the RC coupling, voltages on the select erase gate 24 can result in a faster read operation.

Figure 4:
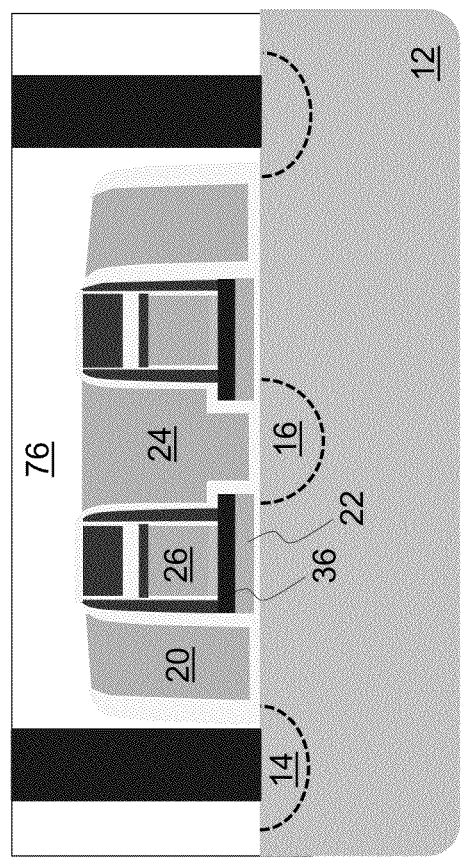
FIG. 4 is a cross sectional view of an alternate embodiment of the memory cell of the present invention.

FIG. 4 illustrates a first alternate embodiment. In this embodiment, the metal layer 36 extends across the entire upper surface of the floating gate 22. Therefore, during erase, the electrons tunnel from the corner of the metal layer 36 to the erase gate 24. In this configuration, the metal work function should not be much higher than silicon so as to not slow down the erase operation.

Figure 5:
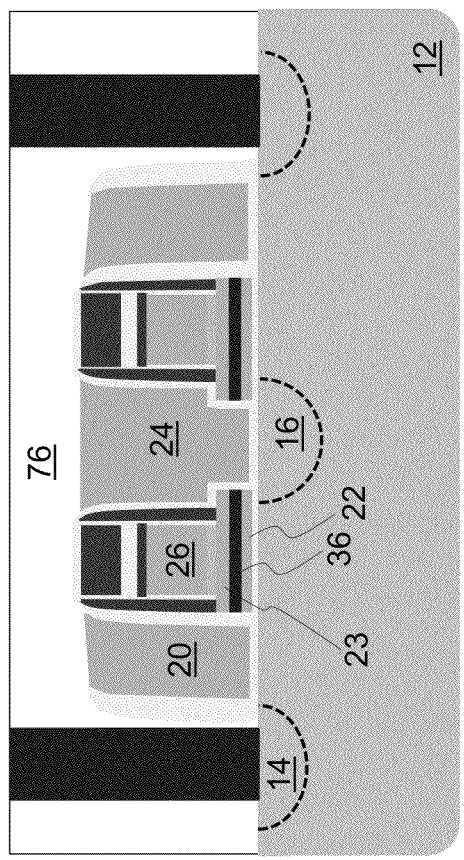
FIG. 5 is a cross sectional view of a second alternate embodiment of the memory cell of the present invention.

FIG. 5 illustrates a second alternate embodiment. In this embodiment, an additional layer 23 of polysilicon is formed over the metal layer. Thus, the floating gate 22/23 is constituted by two layers of polysilicon 22/23 with a layer of metal 36 sandwiched in-between. This configuration preserves the poly-to-poly tunneling during erase, yet allows the metal layer 36 to extend across the full width of the floating gate.

Figure 6:
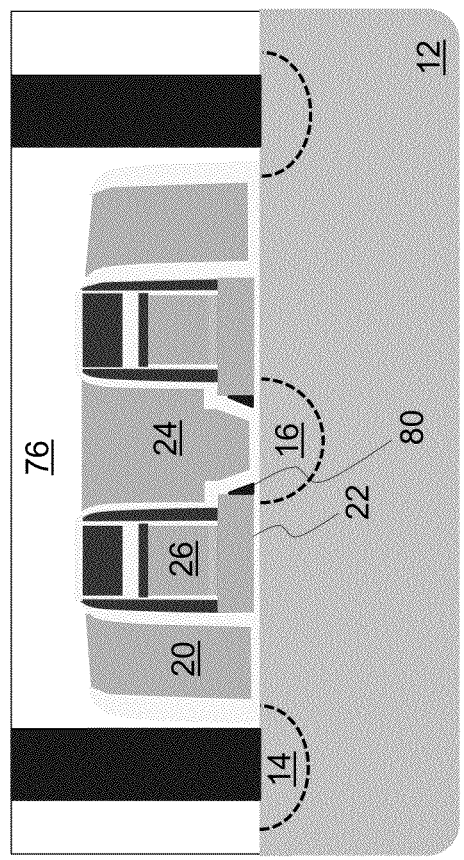
FIG. 6 is a cross sectional view of a third alternate embodiment of the memory cell of the present invention.

FIG. 6 illustrates a third alternate embodiment. In this embodiment, the metal layer 36 on the top surface of the floating gate 22 is replaced by metal spacers 80 formed

| WL (20) | | BL (78) | | SL (16) | | CG (26) | | EG (24) | |
|---|---|---|---|---|---|---|---|---|---|
| Select | Unselect | Select | Unselect | Select | Unselect | Select | Unselect | Select | Unselect |
| 0 v | 0 v | 0 v | 0 v | 0 v | 0 v | 0 v or −1 to −10 v | 0 v | 9-15 v or 7-9 v | 0 v |

During erase, a negative voltage from −1 to −10 volts may be applied to the select control gate 26. In that event, the voltage applied to the select erase gate 24 may be lowered down to 6-9 volts. The "overhang" of the erase gate 24 shields the tunneling barrier from the negative voltage applied to the select control gate 26.

For programming, the following voltages may be applied.

| WL (20) | | BL (78) | | SL (16) | | CG (26) | | EG (24) | |
|---|---|---|---|---|---|---|---|---|---|
| Select | Unselect | Select | Unselect | Select | Unselect | Select | Unselect | Select | Unselect |
| 1-2 v | 0 v | 0.5-5uA | 1.5-3 v | 3-6 v | 0 v | 6-12 v | 0 v | 3-9 v | 0 v |

During programming, the selected cell is programmed through efficient hot-electron injection with the portion of the channel under the floating gate in inversion. The medium voltage of 3-6 volts is applied to the select SL to generate the hot electrons. The select control gate 26 and erase gate 24 are biased to a high voltage (6-9 volts) to utilize the high coupling ratio and to maximize the voltage coupling to the floating against the sides of the floating gates 22. This configuration also preserves the poly-to-poly tunneling during erase.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A non-volatile memory cell comprising:
   a substrate of a first conductivity type, having a first region of a second conductivity type, a second region of the second conductivity type spaced apart from the first region, forming a channel region therebetween;
   a select gate insulated from and disposed over a first portion of the channel region which is adjacent to the first region;
   a floating gate insulated from and disposed over a second portion of the channel region which is adjacent the second region, wherein the floating gate is formed of polysilicon;
   metal material formed in contact with the floating gate;
   a control gate insulated from and disposed over the floating gate;
   an erase gate that includes first and second portions, wherein:
      the first portion is insulated from and disposed over the second region, and is insulated from and disposed laterally adjacent to the floating gate; and
      the second portion is insulated from and laterally adjacent to the control gate, and partially extends over and vertically overlaps the floating gate;
   wherein the metal material is disposed as a layer on a top surface of the floating gate, and wherein the layer of the metal material extends over only a portion of the top surface of the floating gate, wherein the layer of the metal material does not extend over any portion of the top surface over which the erase gate second portion extends.

2. A method of forming a non-volatile memory cell comprising:
   forming, in a substrate of a first conductivity type, spaced apart first and second regions of a second conductivity type, defining a channel region therebetween;
   forming a select gate insulated from and disposed over a first portion of the channel region which is adjacent to the first region;
   forming a floating gate of polysilicon material insulated from and disposed over a second portion of the channel region which is adjacent the second region;
   forming metal material in contact with the floating gate;
   forming a control gate insulated from and disposed over the floating gate;
   forming an erase gate that includes first and second portions, wherein:
      the first portion is insulated from and disposed over the second region, and is insulated from and disposed laterally adjacent to the floating gate; and
      the second portion is insulated from and laterally adjacent to the control gate, and partially extends over and vertically overlaps the floating gate;
   wherein the metal material is disposed as a layer on a top surface of the floating gate, and wherein the layer of the metal material extends over only a portion of the top surface of the floating gate, wherein the layer of the metal material does not extend over any portion of the top surface over which the erase gate second portion extends.

* * * * *